(12) United States Patent
Chen

(10) Patent No.: US 7,586,328 B2
(45) Date of Patent: Sep. 8, 2009

(54) SHIFT REGISTER DRIVING CIRCUIT AND LEVEL SHIFTER THEREOF

(75) Inventor: Chung-Chun Chen, Kaohsiung (TW)

(73) Assignee: AU Optronics Corp., Hsin-Chu (TW)

( * ) Notice: Subject to any disclaimer, the term of this patent is extended or adjusted under 35 U.S.C. 154(b) by 706 days.

(21) Appl. No.: 11/254,736

(22) Filed: Oct. 21, 2005

(65) Prior Publication Data
US 2007/0001986 A1    Jan. 4, 2007

(30) Foreign Application Priority Data
Jul. 1, 2005    (TW) ............................. 94122413 A

(51) Int. Cl.
H03K 19/094   (2006.01)
H03K 19/0175  (2006.01)
G09G 3/36     (2006.01)

(52) U.S. Cl. ........................................ 326/68; 345/100

(58) Field of Classification Search ................... 326/62, 326/81–83; 327/108, 109, 534, 535, 475; 345/84, 99, 100
See application file for complete search history.

(56) References Cited

U.S. PATENT DOCUMENTS 6,633,192 B2   10/2003   Tsuchiya
6,696,858 B2   2/2004    Tokai
6,741,230 B2   5/2004    Sakai et al.
7,427,971 B2*  9/2008    Eom ........................... 345/82
2005/0264514 A1* 12/2005 Kim et al. .................... 345/100
2006/0044247 A1*  3/2006 Jang et al. ..................... 345/98
2007/0195053 A1*  8/2007 Tobita et al. ................. 345/100

FOREIGN PATENT DOCUMENTS

TW    578379    3/2004
TW    580793    3/2004

* cited by examiner

*Primary Examiner*—Vibol Tan
*Assistant Examiner*—Dylan White
(74) *Attorney, Agent, or Firm*—Bacon & Thomas, PLLC

(57) ABSTRACT

A level shifter includes a first switch, a second switch, an energy storing device, a loading device, a third switch, a diode, a forth switch, a transistor, and a fifth switch. The first switch, coupled to a first voltage, is controlled by an input signal. The second switch, coupled to the first switch, is controlled by a control signal. The energy storing device is coupled to the first and second switches. The loading device is coupled to the energy storing device. The third switch, coupled to the loading device, is controlled by a shift register anti-phase signal. The diode is coupled to the loading device and third switch. The forth switch, coupled to the diode, is controlled by the shift register anti-phase signal. The transistor is coupled to the diode for outputting an output signal. The fifth switch, coupled to the transistor, is controlled by the shift register anti-phase signal.

18 Claims, 5 Drawing Sheets

SHIFT REGISTER DRIVING CIRCUIT AND LEVEL SHIFTER THEREOF

This application claims the benefit of Taiwan application Serial No. 94122413, filed Jul. 1, 2005, the subject matter of which is incorporated herein by reference.

BACKGROUND OF THE INVENTION

1. Field of the Invention

The invention relates in general to a shift register driving circuit and level shifter thereof, and more particularly to a shift register driving circuit designed by using a single type of metal oxide semiconductor (MOS) field effect transistors and level shifter thereof.

2. Description of the Related Art

Low temperature polysilicon (LTPS) liquid crystal displays (LCDs) are mainstream in development of present consumer electronic products, and mainly applied to displays of high integration and high picture quality. Conventionally, the shift register and level shifter of a liquid crystal driving circuit are designed by using complementary MOS (CMOS) field effect transistors. However, the shift register driving circuit and level shifter require a larger number of photo masks as manufactured by using CMOS transistors, and the manufacturing process is very complicated, thereby increasing cost of the whole LCD.

SUMMARY OF THE INVENTION

It is therefore an object of the invention to provide a shift register driving circuit and level shifter thereof. The shift register driving circuit and level shifter are designed by using a single type of MOS transistors to have low power consumption, thereby achieving the purpose of reducing manufacturing cost and power consumption of the LCD.

The invention achieves the above-identified object by providing a level shifter including a first switch, a second switch, an energy storing device, a loading device, a third switch, a diode, a forth switch, a transistor, and a fifth switch. The first switch is controlled by an input signal and coupled to a first voltage. The second switch is coupled to the first switch and controlled by a first control signal. The energy storing device has a first terminal for receiving a shift register signal, and a second terminal coupled to a first node located between the first switch and the second switch. The loading device is coupled to the second terminal of the energy storing device. The third switch is coupled to the loading device and controlled by a shift register anti-phase signal, wherein the shift register anti-phase signal has a phase inverse to the shift register signal. The diode has a positive terminal and a negative terminal wherein the negative terminal is coupled to a second node between the loading device and the third switch. The forth switch is coupled to the positive terminal of the diode and controlled by the shift register anti-phase signal. The transistor has a gate coupled to the positive terminal of the diode, a first source/drain for outputting an output signal, and a second source/drain coupled to a second voltage. The fifth switch is coupled to the first source/drain of the transistor and controlled by the shift register anti-phase signal.

The invention achieves the above-identified object by providing a shift register driving circuit including a shift register and a level shifter. The shift register is for receiving an input signal and outputting a shift register signal. The level shifter includes a first switch, a second switch, an energy storing device, a loading device, a third switch, a diode, a forth switch a transistor, and a fifth switch. The first switch is controlled by the input signal and coupled to a first voltage. The second switch is coupled to the first switch, and controlled by a control signal. The energy storing device has a first terminal for receiving a shift register signal, and a second terminal coupled to a first node located between the first switch and the second switch. The loading device is coupled to the second terminal of the energy storing device. The third switch is coupled to the loading device and controlled by a shift register anti-phase signal, wherein the shift register anti-phase signal has a phase inverse to the shift register signal. The diode has a positive terminal and a negative terminal. The negative terminal is coupled to a second node between the loading device and the third switch. The forth switch is coupled to the positive terminal of the diode and controlled by the shift register anti-phase signal. The transistor has a gate coupled to the positive terminal of the diode, a first source/drain for outputting an output signal, and a second source/drain coupled to a second voltage. The fifth switch is coupled to the first source/drain of the transistor and controlled by the shift register anti-phase signal.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
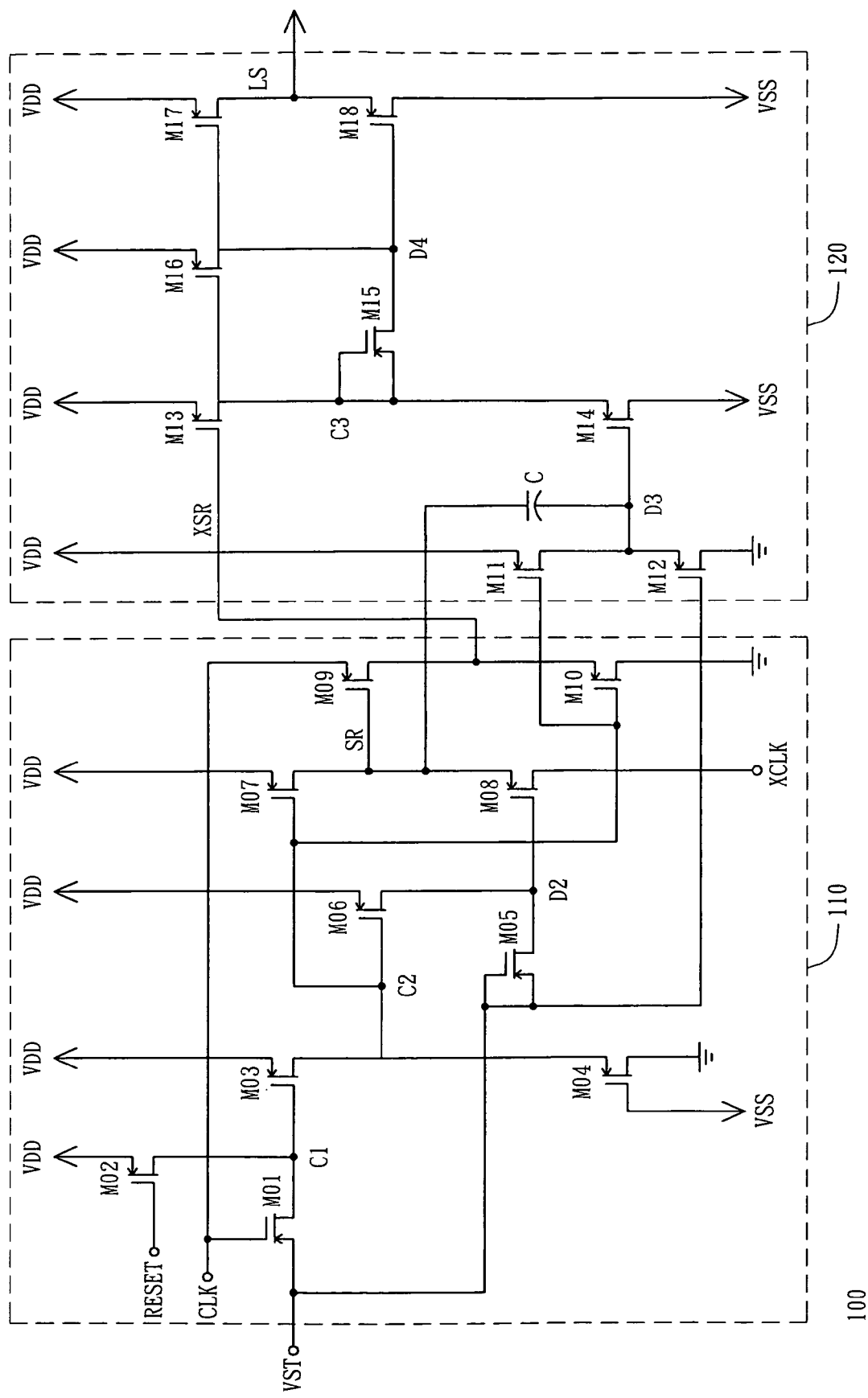
FIG. 1 is a circuit diagram of a shift register driving circuit according to a preferred embodiment of the invention.

Referring to FIG. 1, a circuit diagram of a shift register driving circuit according to a preferred embodiment of the invention is shown. The shift register driving circuit 100, for example, applied in a LCD, includes a shift register 110 and a level shifter 120. The shift register 110 receives an input signal VST and outputs a shift register signal SR, a shift register anti-phase signal XSR, and a control signal C2 to the level shifter 120 according to a clock signal CLK. The p-type MOS (PMOS) transistor M01 of the shifter register 110, used for signal lock out, receives the input signal VST, and outputs a control signal C1 according to the control of the clock signal CLK. The control signal C1 output the control signal C2 having a phase inverse to the control signal C1 through an inverter composed of PMOS transistors M03 and M04. The control signal C2 is inputted to the gate of the PMOS transistor M07 to output the shift register signal SR at the drain of the PMOS transistor M07. The shift register signal SR outputs the shift register anti-phase signal XSR through an inverter composed of PMOS transistors M09 and M10. The shift register anti-phase signal XSR is an inversed signal of the shift register signal SR.

The level shifter 120 includes PMOS transistors M11 and M12, a capacitance C, PMOS transistors M13 and M14, a diode, connected PMOS transistor M15, and PMOS transistors M16, M17, and M18. The transistor M12 has a gate, controlled by the input signal VST, and a drain coupled to a ground voltage GND. The transistor M11 has a drain coupled to the source of the transistor M12, a gate controlled by the control signal C2, and a source coupled to an operational voltage VDD, such as 9V. The capacitance has a positive terminal (+) for receiving the shift register signal SR, and a negative terminal (−) coupled to a first node D3 located between the transistors M11 and M12. The transistor M14 has a gate coupled to the negative terminal of the capacitance C and a drain coupled to an operational voltage VSS, such as −6V. The transistor M13 has a drain coupled to the source of the transistor M14, a gate controlled by the shift register anti-phase signal XSR, and a source coupled to the operational voltage VDD.

Furthermore, the diode-connected transistor M15 has a negative terminal (coupling the gate and drain), coupled to a second node C3 located between the transistors M14 and M13, and a positive terminal (i.e. the source) coupled to the drain of the transistor M16. The transistor M16 has a gate controlled by the shift register anti-phase signal XSR, and a source coupled to the operational voltage VDD. The transistor M18 has a gate coupled to the positive terminal (the source) of the transistor M15, a source for outputting an output signal LS, and a drain coupled to the operational voltage VSS. Besides, the transistor M17 has a drain coupled to the source of the transistor M18, a gate controlled by the shift register anti-phase signal XSR and a source coupled to the operational voltage VDD.

Figure 2:
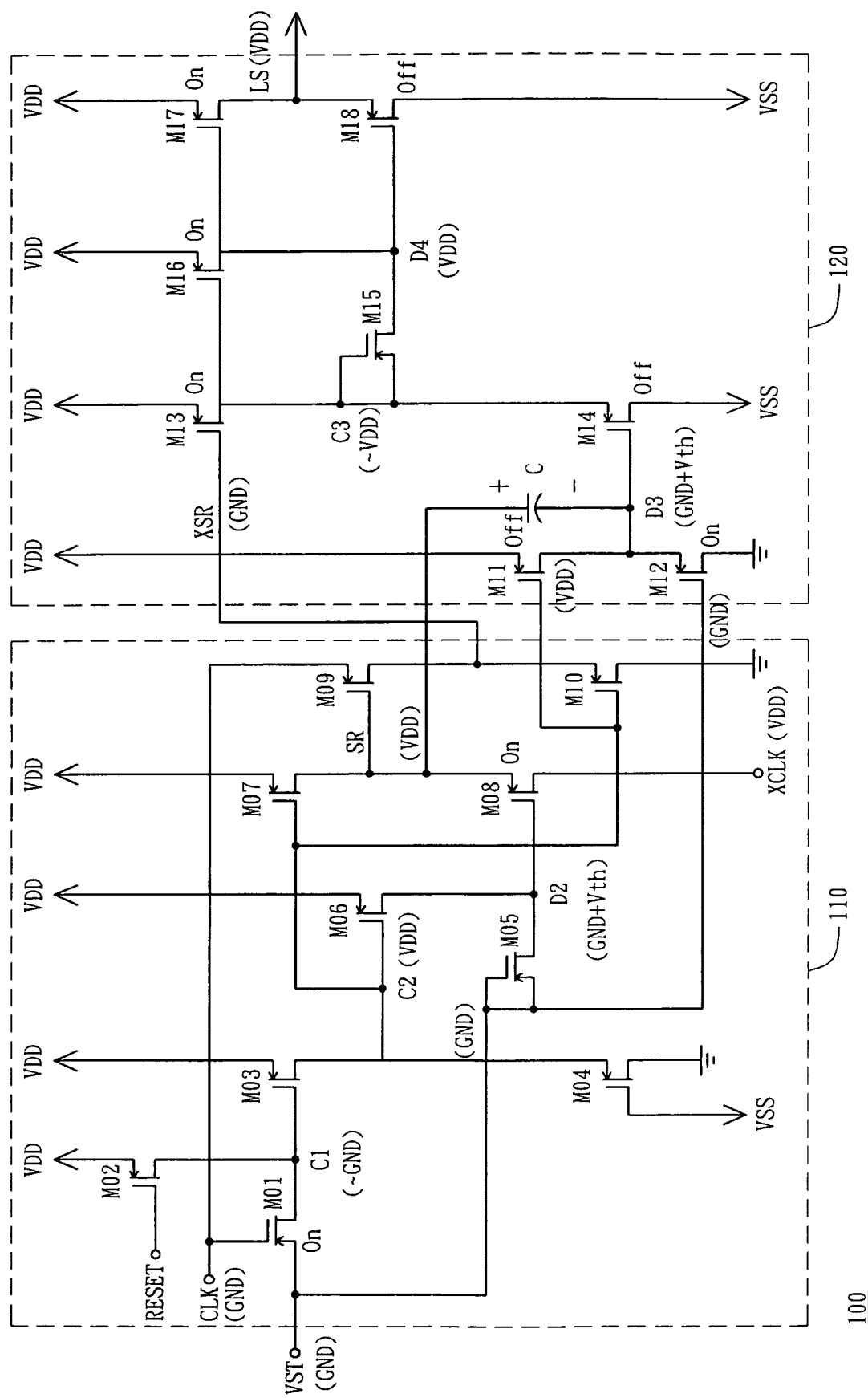
FIG. 2 is a schematic diagram showing a turn-on or turn-off state of the transistors M01, M03~M18, and voltage levels at positive and negative terminals of the capacitance C, nodes D3, C3 and D4 in the shift register driving circuit of FIG. 1 in a first period T1.
Figure 3:
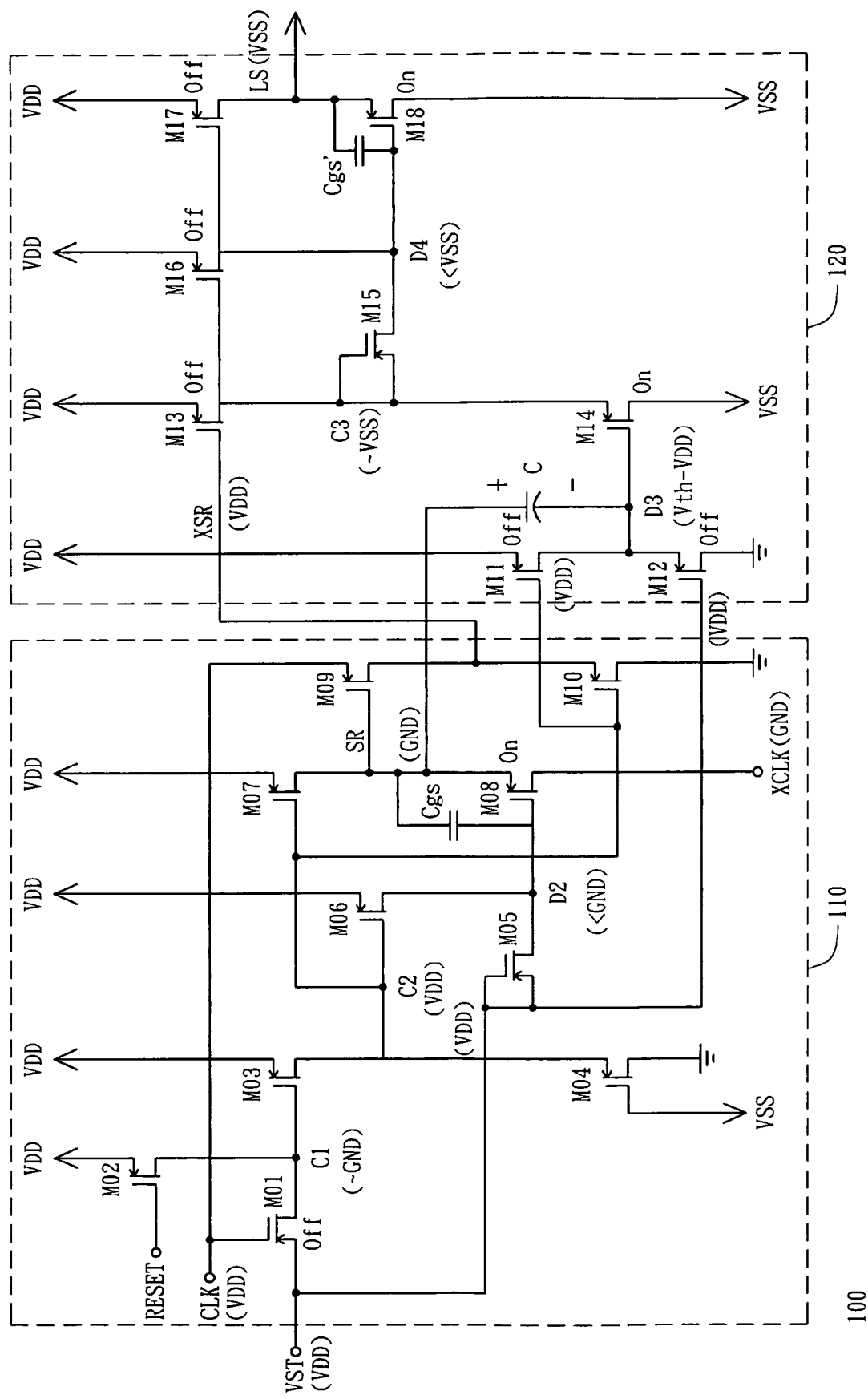
FIG. 3 illustrates a schematic diagram showing a turn-on or turn-off state of the transistors M01, M03~M18, and voltage levels at positive and negative terminals of the capacitance C, nodes D3, C3 and D4 in the shift register driving circuit of FIG. 1 in a second period T2.
Figure 4A:
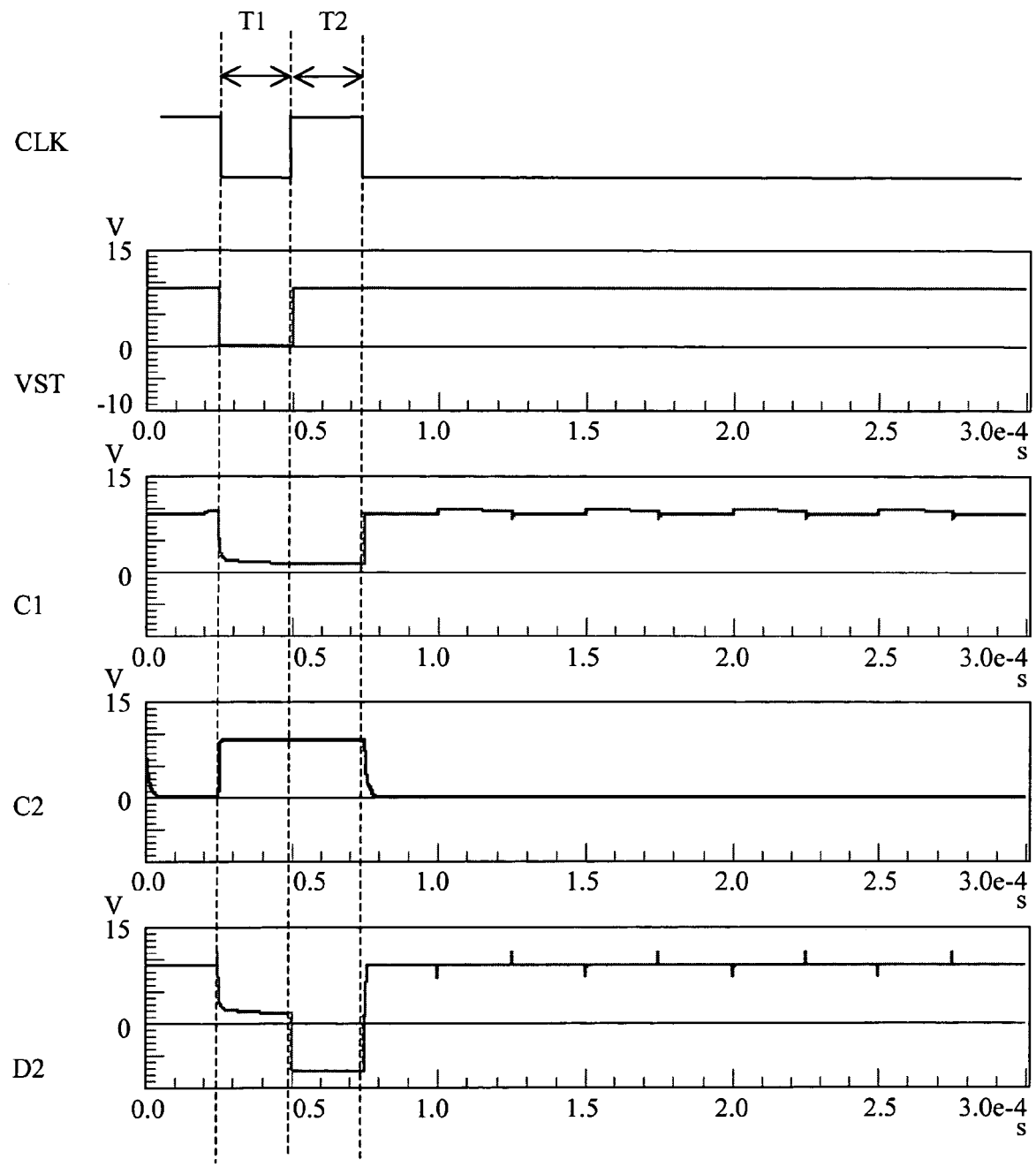
FIG. 4A is a timing diagram of the input signal VST, control signals C1 and C2, and a signal at a node D2 of the shift register in the shift register driving circuit of FIG. 1.
Figure 4B:
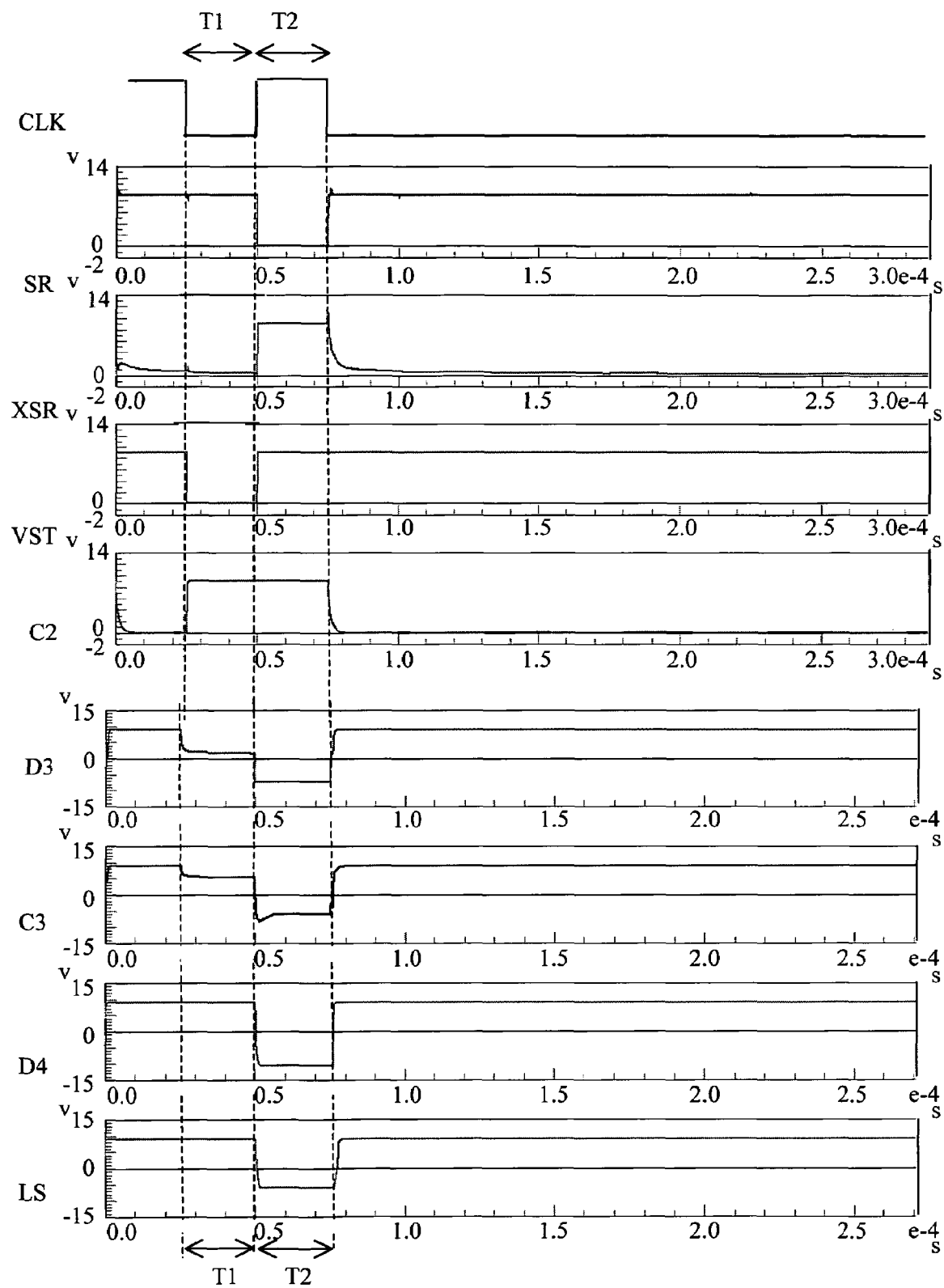
FIG. 4B shows a timing diagram of the shift register signal SR, shift register anti-phase signal XSR, input signal VST, control signal C2, signals at nodes D3, C3, and D4, and output signal LS of the level shifter in the shift register driving circuit of FIG. 1 corresponding to the clock signal CLK.

FIG. 2 is a schematic diagram showing a turn-on or turn-off state of the transistors M01, M03~M18, and voltage levels at positive and negative terminals of the capacitance C, nodes D3, C3 and D4 in the shift register driving circuit 100 of FIG. 1 in a first period T1. FIG. 3 illustrates a schematic diagram of a turn-on or turn-off state of the transistors M01, M03~M18, and voltage levels at positive and negative terminals of the capacitance C, nodes D3, C3 and D4 in the shift register driving circuit 100 of FIG. 1 in a second period T2. FIG. 4A is a timing diagram of the input signal VST, control signals C1 and C2, and a signal at a node D2 of the shift register 110 in the shift register driving circuit 100 of FIG. 1. FIG. 4B shows a timing diagram of the shift register signal SR, shift register anti-phase signal XSR, input signal VST, control signal C2, signals at nodes D3, C3, and D4, and output signal LS of the level shifter 120 in the shift register driving circuit 100 of FIG. 1 corresponding to the clock signal CLK.

Referring to FIG. 2 and FIG. 4A at the same time, in the first period T1, the input signal has a GND level, and the signal CLK has a GND level, meanwhile the transistor M01 is turned on such that the node C1 has a level close to GND. The control signal C2 has a phase inverse to the control signal C1, so the control signal C2 has a VDD level. Due to features of the diode-connected transistor M05, the voltage at the node D2 is higher than the signal VST by a threshold voltage Vth, ie. $V_{D2}$=GND+Vth. At this time, the transistor M07 is turned off and the transistor M08 is turned on, so the shift register signal SR has a level (=VDD), the same with the signal XCK level.

Furthermore, referring to FIG. 2 and FIG. 4B at the same time, in the first period T1, the transistor M12 is turned on for the input signal VST has the GND level, while the transistor M11 is turned off for the control signal C2 has the VDD level. The turned-on transistor M12 causes the voltage $V_{D3}$ at the negative terminal of the capacitance C (i.e. the source voltage of the transistor M12) to have a higher level than the gate voltage (=GND) of the transistor M12 by a Vth (about 2.5V), that is, $V_{D3}$=GND+Vth. Moreover, the shift register signal SR having a VDD level is inputted to the positive terminal of capacitance C and charges the capacitance C to have a voltage drop (VDD−Vth). Meanwhile, the transistor M14 is turned off since the gate voltage (=GND+Vth~2.5V) of the transistor M14 is higher than the drain voltage (=VSS~−6V). Moreover, for the shift register anti-phase signal XSR has the GND level, the transistors M13, M16 and M17 are turned on to respectively input the operational voltage VDD (=9V) to the nodes C3, D4, and the drain of the transistor M17. Due to features of the diode-connected transistor M15, the voltage level at the node C3 is slightly lower than the voltage level VDD at the node C3. Meanwhile, the transistor M18 is turned off since its gate voltage (=VDD~9V) is higher than its drain voltage (=VSS~−6V), and the drain of the transistor M17 outputs the output signal LS having the VDD level.

Referring to FIG. 3 and FIG. 4A at the same time, in the second period T2, the input signal VST has the VDD level, and the clock CLK has the VDD level too. Therefore, the transistor M01 is turned off, the control signal C1 maintains a level close to GND, the control signal C2 has still the VDD level, and the transistor is turned off. The source voltage of the transistor M08 changes from a VDD level to a floating state. Due to parasitic capacitance Cgs of the source and the gate of the transistor M08, when the signal XCK has a level dropping from VDD to GND, the voltage at the node D2 is dropped to below the GND level, causing the transistor to be turned on completely and the shift register signal SR has the GND level.

Referring to FIG. 3 and FIG. 4B at the same time, in the second period T2, the input signal VST, the control signal C2, and the shift register anti-phase signal XSR all have the VDD level. As a result, the transistors M11, M12, M13, M16, and M17 are all turned off. At this time, the shift register signal SR has the GND level, the voltage at the positive terminal of the capacitance C drops from VDD to GND and the capacitance C discharges, meanwhile the negative terminal voltage VD3 of the capacitance C is lowered down from (GND+Vth) to (Vth−VDD) (~2.5V−9V=−6.5V). Since the gate voltage (~−6.5V) of the transistor M14 is slightly lower than the drain voltage (−6V) thereof, the transistor is not turned on.

The feature of the invention lies on that the source voltage of the transistor M18 changes from VDD (9V) to a floating state (i.e. the source current is zero) due to turn-off of the transistor M17 in the level shifter 120 in the second period T2. Moreover, since the parasitic capacitance Cgs' formed between the gate and the source of the transistor M18, the voltage at the node D4 drops from VDD (9V) to below the drain voltage VSS (−6V) of the transistor M18 to cause the transistor M18 turned on to output an output signal LS having the VSS level at its source. Meanwhile, the voltage at the node C3 is lowered down to about VSS along with the voltage at the node D4 to cause the transistor M14 turned on completely. Therefore, the input signal VST (GND/VDD) can output the output signals LS with different levels (VDD/VSS) by using the level shifter 120 to achieve the level shifting purpose.

As mentioned above, although the level shifter 120 including PMOS transistors M11~M18 and the capacitance C is taken as an example in the invention, the level shifter of the invention can also be designed by using another type of transistors, such as NMOS transistors. The transistors M11, M12, M13, M16 and M17 can also be other switch devices, for example, are respectively a first switch to a fifth switch. The first and the second switches are respectively controlled by the control signal C2 and the input signal VST, and the third to fifth switches are controlled by the shift register anti-phase signal XSR. The transistor M14 can also be another loading device, coupled in between the nodes C3 and D3, and the transistor M15 can also be another type of diode coupled in between the nodes C3 and D4. Moreover, the capacitance can also be another energy storing device. Since the first switch is turned on, the second switch is turned off, and the third to fifth switches are all turned on, the energy storing device charges and the transistor M18 is turned off in the first period and the first to the fifth switches are all turned off and the energy storing device discharges to change its voltage drop and cause the transistor M18 turned on, the purpose of level shifting can be achieved as mentioned above. Therefore, all these will not depart from the skill scope of the invention.

As mentioned above, although p-type shift register (all transistors used are PMOS transistors) is taken as an example in the shift register driving circuit of the invention, the shift register and level shifter in the shift register driving circuit of the invention can also be designed by another single type of transistors, such as NMOS transistors. Moreover, the level shifter 120 can also use another control signal C2 to control the transistor M11. Since the control signal C2 can cause the transistor M11 turned off in the first and second periods, the purpose of level-shifting the output signal can be achieved. Therefore, all the alternatives are not also apart from the skill scope of the invention.

The shift register driving circuit and level shifter thereof according to the above-mentioned embodiment of the invention has the following advantages. The manufacturing process of using a single type of transistors (such as PMOS transistors) can simplify procedures of manufacturing the shift register driving circuit and reduce power consumption in operation, thereby effectively saving manufacturing cost of the whole LCD.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter, comprising:
   a first switch, controlled by an input signal and coupled to a first voltage;
   a second switch, coupled to the first switch, and controlled by a control signal;
   an energy storing device, having a first terminal and a second terminal, the first terminal for receiving a shift register signal, the second terminal coupled to a first node located between the first switch and the second switch;
   a loading device, coupled to the second terminal of the energy storing device;
   a third switch, coupled to the loading device, and controlled by a shift register anti-phase signal, wherein the shift register anti-phase signal has a phase inverse to the shift register signal;
   a diode, having a positive terminal and a negative terminal, the negative terminal coupled to a second node between the loading device and the third switch;
   a forth switch, coupled to the positive terminal of the diode and controlled by the shift register anti-phase signal;
   a transistor, having a gate, a first source/drain, and a second source/drain, the gate coupled to the positive terminal of the diode, the first source/drain for outputting an output signal, the second source/drain coupled to a second voltage; and
   a fifth switch, coupled to the first source/drain of the transistor and controlled by the shift register anti-phase signal.

2. The level shift according to claim 1, wherein during a first period, the first switch is turned on, the second switch is turned off, the third switch, the forth switch and the fifth switch are all turned on, the second terminal of the energy storing device is coupled to the first voltage via the first switch, the shift register signal has a first level to charge the energy storing device, a third voltage is inputted to the negative terminal and positive terminal of the diode and the first source/drain respectively via the third switch, the forth switch and the fifth switch, the transistor is turned off, and the output signal has a level substantially equal to the third voltage; during a second period, the first switch, the second switch, the third switch, the forth switch and the fifth switch are all turned off, the shift register signal has a second level to change a level of the second terminal of the energy storing device and turn off the transistor, and the output signal has a level equal to the second voltage.

3. The level shift according to claim 1, wherein the first switch, the second switch, the third switch, the forth switch, the fifth switch, the diode and the transistor are all designed by using p-type metal oxide semiconductor (PMOS) transistors.

4. The level shift according to claim 3, wherein during the first period, the input signal has a level equal to the first voltage, and the control signal has the first level.

5. The level shift according to claim 4, wherein during the second period, the input signal has a level equal to the third voltage, and the control signal has the first level.

6. The level shift according to claim 5, wherein the first voltage is a first low voltage, the second voltage is a second low voltage, the third voltage is a high voltage, the first level is a high level, and the second level is a low level.

7. The level shift according to claim 1, wherein the loading device is a MOS transistor, having a gate coupled to the second terminal of the energy storing device, a first source/drain coupled to the third switch, and a second source/drain coupled to the second voltage.

8. The level shift according to claim 1, wherein the energy storing device is a capacitance.

9. A shift register driving circuit, comprising:
   a shift register, for receiving an input signal and outputting a shift register signal; and
   a level shifter, comprising:
      a first switch, controlled by the input signal and coupled to a first voltage;
      a second switch, coupled to the first switch, and controlled by a control signal;
      an energy storing device, having a first terminal and a second terminal, the first terminal for receiving a shift register signal, the second terminal coupled to a first node located between the first switch and the second switch;
      a loading device, coupled to the second terminal of the energy storing device;

a third switch, coupled to the loading device, and controlled by a shift register anti-phase signal, wherein the shift register anti-phase signal has a phase inverse to the shift register signal;

a diode, having a positive terminal and a negative terminal, the negative terminal coupled to a second node between the loading device and the third switch;

a forth switch, coupled to the positive terminal of the diode and controlled by the shift register anti-phase signal;

a transistor, having a gate, a first source/drain, and a second source/drain, the gate coupled to the positive terminal of the diode, the first source/drain for outputting an output signal, the second source/drain coupled to a second voltage; and a fifth switch, coupled to the first source/drain of the transistor and controlled by the shift register anti-phase signal.

10. The shift register driving circuit according to claim 9, wherein in a first period, the first switch is turned on, the second switch is turned off, the third switch, the forth switch and the fifth switch are all turned on, the second terminal of the energy storing device is coupled to the first voltage via the first switch, the shift register signal has a first level to discharge the energy storing device, a third voltage is inputted to the negative terminal and positive terminal of the diode and the first source/drain respectively via the third switch, the forth switch and the fifth switch, the transistor is turned off, and the output signal has a level substantially equal to the third voltage; in a second period, the first switch, the second switch, the third switch, the forth switch and the fifth switch are all turned off, the shift register signal has a second level to change a level of the second terminal of the energy storing device and turn off the transistor, and the output signal has a level equal to the second voltage.

11. The shift register driving circuit according to claim 10, wherein the first switch, the second switch, the third switch, the forth switch, the fifth switch, the diode and the transistor are all designed by using P-type metal oxide semiconductor (PMOS) transistors.

12. The shift register driving circuit according to claim 11, wherein during the first period, the input signal has a level equal to the first voltage, and the control signal has the first level.

13. The shift register driving circuit according to claim 12, wherein the input signal has a level equal to the third voltage, and the control signal has the first level.

14. The shift register driving circuit according to claim 13, wherein the first voltage is a first low voltage, the second voltage is a second low voltage, the third voltage is a high voltage, the first level is a high level, and the second level is a low level.

15. The shift register driving circuit according to claim 11, wherein the shift register is a p-type shift register.

16. The shift register driving circuit according to claim 9, wherein the loading device is a MOS transistor having a gate coupled to the second terminal of the energy storing device, a first source/drain coupled to the third switch, and a second source/drain coupled to the second voltage.

17. The shift register driving circuit according to claim 9, wherein the energy storing device is a capacitance.

18. The shift register driving circuit according to claim 9, wherein the shifter register comprises a switch for receiving the input signal and outputting an interior signal and the control signal has a phase inverse to the interior signal.

* * * * *

UNITED STATES PATENT AND TRADEMARK OFFICE
CERTIFICATE OF CORRECTION

PATENT NO. : 7,586,328 B2  Page 1 of 1
APPLICATION NO. : 11/254736
DATED : September 8, 2009
INVENTOR(S) : Chung-Chun Chen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 992 days.

Signed and Sealed this

Fourteenth Day of September, 2010

David J. Kappos
*Director of the United States Patent and Trademark Office*